United States Patent [19]

Boudreaux

[11] Patent Number: 5,512,819
[45] Date of Patent: Apr. 30, 1996

[54] ASSEMBLY AND ASSOCIATED METHOD FOR LOCATING A SELECTED WIRE OF A WIREMAT

[75] Inventor: Randall J. Boudreaux, Colorado Springs, Colo.

[73] Assignee: Dasu Limited Liability Company, Houston, Tex.

[21] Appl. No.: 214,829

[22] Filed: Mar. 17, 1994

[51] Int. Cl.⁶ .................. G01R 19/155; G01R 31/08
[52] U.S. Cl. .............................. 324/66; 324/527
[58] Field of Search ................... 324/66, 67, 239, 324/540, 541, 542, 527, 528, 529, 530

[56] References Cited

U.S. PATENT DOCUMENTS

| | | | |
|---|---|---|---|
| 2,962,659 | 11/1960 | Neill | 324/540 |
| 3,430,135 | 2/1969 | Mullen | 324/540 |
| 3,678,379 | 7/1972 | Arvay et al. | 324/539 |
| 3,882,287 | 5/1975 | Simmonds | 324/66 |
| 3,893,025 | 7/1975 | Humphreys, Jr. | 324/67 |
| 4,044,299 | 8/1977 | Weber | 324/67 |
| 4,458,113 | 7/1984 | Tolman | 324/66 |
| 4,506,210 | 3/1985 | Chase | 324/66 |
| 4,901,003 | 2/1990 | Clegg | 324/539 |

*Primary Examiner*—Sandra L. O'Shea
*Assistant Examiner*—Roger Phillips
*Attorney, Agent, or Firm*—Holland & Hart

[57] ABSTRACT

An assembly, and an associated method, locates selected wires positioned amongst a plurality of wires in a wiremat. An oscillating signal is applied to the selected wires; all other wires are connected to an electrical ground potential to minimize effects of capacitive coupling. A sensing probe is positioned amongst the plurality of wires of the wiremat and a constant magnitude, variable frequency annunciation signal is generated having a frequency which varies corresponding to the proximity of the sensing probe to the selected wires.

12 Claims, 9 Drawing Sheets

Fig_1

Fig_7

Fig_8

Fig. 10

ASSEMBLY AND ASSOCIATED METHOD FOR LOCATING A SELECTED WIRE OF A WIREMAT

The present invention relates generally to a conductive wire locating assembly and method for locating wires positioned in a wiremat. More particularly, the present invention relates to a new and improved assembly and associated method for locating selected wires of a wiremat with a sensing probe wherein an annunciator signal is generated which is of a frequency which varies responsively to the proximity of the sensing probe to the selected wires.

BACKGROUND OF THE INVENTION

Very high capacity computers typically include large numbers of independently operable circuits which are capable of concurrent operation to perform simultaneous computations. Such circuits are interconnected to permit computations performed by some of the circuits to be provided to certain others of the circuits. Because computations may then be performed simultaneously, the overall tasks to be performed by such computers can be completed much more quickly and with a speed directly proportional to the number of such independently operable circuits.

To further increase the computational rate of the individual circuits making up these very high capacity computers, the circuit elements are preferably made up of materials best able to operate at high speeds. Circuit elements constructed of various integrated circuits ("IC"), for instance, may be fabricated utilizing gallium-arsenide devices rather than more conventional silicon substrate ICs as integrated circuits formed of gallium-arsenide materials are capable of higher speeds of operation.

While integrated circuits formed of gallium-arsenide materials are capable of higher operating speeds, conventional fabrication techniques typically limit the number of component elements which may be formed on a single integrated circuit substrate. As a result, when gallium-arsenide integrated circuits are used to construct the computational circuitry of a computer, a relatively large number of integrated circuits must be interconnected to one another.

In addition, a large number of connections are also required to then be made between other independently operable circuits of the computer. Typically, this is accomplished by connecting conductive wires to the pins of the integrated circuits at proximal ends thereof. Thereafter, connections between the integrated circuits are formed by connecting the distal ends of these wires extending from selected pins of the various integrated circuits. Solder connections, for example, may then be made and once the wires are connected together, the connections between the integrated circuits are formed.

Large numbers of wires coupled to such pin connections are therefore required to be connected together to form the necessary connections between the independently operable circuits. As a result, selected wires connected to specific pins of the integrated circuits must be individually located from among the larger collection of wires to permit their proper connection.

Moreover, the proximal end portions of the wires extending from the integrated circuits are typically positioned adjacent to one another in a relatively small area. The collection of these adjacently positioned wires form a wiremat and a great deal of time and diligence may be required to locate specific wires in the wiremat prior to their proper interconnection.

A number of techniques have been developed to facilitate the location of the wires within a wiremat which are to be connected together. In one existing apparatus, a dc current is applied to the proximal end portions of certain wires and a current sensing probe is positioned at the distal end portions of the wires. When the current sensing probe is positioned in electrical connection with a wire to which the dc current is applied, the current sensing probe will provide an indication of the connection. This existing apparatus requires the probe to be in actual electrical connection with the proper wire prior to any actual indication by the current sensing probe and no indication is provided when the current sensing probe is positioned proximate to, but not yet in electrical connection with, the wire to which the dc current is applied.

Other known techniques include the application of an ac signal to the proximal end portions of the wires which are to be connected together. The sensing probe includes an inductive amplifier which is capable of detecting times in which the probe is positioned in proximity to the wire to which the ac signal is applied. The sensing probe is thereby able to indicate those times in which the probe is positioned in proximity to the selected wire to facilitate location of the wire to which the ac signal has been applied.

While such techniques permit a determination to be made of those times in which a sensing probe is positioned proximate to certain selected wires, the inductive amplifier utilized in the probe also responds to other spurious ac signals generated by other sources thereby interfering with the detection of the desired ac signals applied to the selected wires. For instance, the inductive amplifier will generally also detect the 60 cycle, ac power signals of conventional power supplies and also spurious signals generated by electronic circuitry, such as data processing equipment. Such signals constitute undesired electronic noise which increases the difficulty of locating the specific wires to which the actual ac signal is supplied.

In operation, the inductive amplifier generates an amplified signal of a signal level which varies in amplitude proportional to the proximity of the sensing probe to the wire to which the ac signal has been applied. The amplified signal is then converted by a transducer into human perceptible form. However, the capacitive coupling between adjacently positioned wires can cause the amplified signal generated by the inductive amplifier to instead identify a wire to which the ac signal is merely capacitively coupled. Such capacitive coupling between adjacently positioned wires therefore makes it more difficult to determine an accurate location of the desired wire.

Because numerous pairs of wires, sometimes in excess of 10,000 pairs of wires, must be located and thereafter connected together, improved techniques to facilitate rapid location of selected wires which are to be connected together would be advantageous.

It is with respect to these considerations and other background information relative to conductive wire locating apparatus and methods that the significant improvements of the present invention have evolved.

SUMMARY OF THE INVENTION

The present invention advantageously provides an assembly, and an associated method, for locating selected wires forming a portion of a plurality of wires which are positioned together to form a wiremat. An oscillating signal is applied to the selected wires with all other wires coupled to an electrical ground potential. A sensing probe is positioned amongst the plurality of wires of the wiremat to sense times in which the sensing probe is positioned proximate to the selected wires upon which the oscillating signal is applied. The sensing probe includes an amplifier which amplifies detected signals and also a filter circuit for filtering all signals but signals of frequencies corresponding to the frequency of the oscillating signal applied to the selected wires. An amplified, filtered signal is generated by the filter circuit and a constant magnitude annunciator signal is generated in response thereto. The annunciator signal is of a frequency representative of the proximity of the sensing probe to the selected wires upon which the oscillating signal is applied. Because all of the wires but the selected wires upon which the oscillating signal is applied are coupled to the ground potential, capacitive coupling of the oscillating signal upon wires positioned adjacent to the selected wires is minimized. Moreover, because the signal detected by the sensing probe is filtered by a bandpass filter, spurious signals are filtered out and do not form portions of the annunciator signal. Also, the annunciator signal is of a variable frequency which is representative of the proximity of the sensing probe to the selected wire upon which the oscillating signal is generated. The annunciator signal is, hence, not the signal detected by the sensing probe. Rather, it is a signal having a frequency dependent upon the intensity of the field strength or the signal detected by the sensing probe.

In accordance with these and other aspects of the present invention, a new assembly, and an associated method, is provided to locate a distal wire portion of at least one selected wire positioned amongst a plurality of wires. Each of the wires of the plurality of wires includes a distal wire portion and a proximal wire portion. An oscillation signal generator generates an electromagnetic field generative, oscillation signal of a desired oscillation frequency. The oscillation signal generator is coupled through a proximal side portion of the selected wire and applies the electromagnetic field generative oscillation signal to the selected wire. At least one sensing probe is positionable amongst the plurality of wires. The probe is operative to sense the proximity of the sensing probe to the distal wire portion of the selected wire upon which the electromagnetic field generative, oscillation signal is generated by the oscillation signal generator. Annunciator circuitry is coupled to the sensing probe for generating an annunciator signal of a frequency representative of the proximity of the sensing probe to the distal wire portion of the selected wire. Location of the distal wire portion of the selected wire is thereby annunciated when the sensing probe is positioned proximate thereto.

A more complete appreciation of the present invention and the scope thereof can be obtained from the accompanying drawings which are briefly summarized below, the following detailed description the presently preferred embodiments of the invention, and the appended claims.

DETAILED DESCRIPTION

Figure 1:
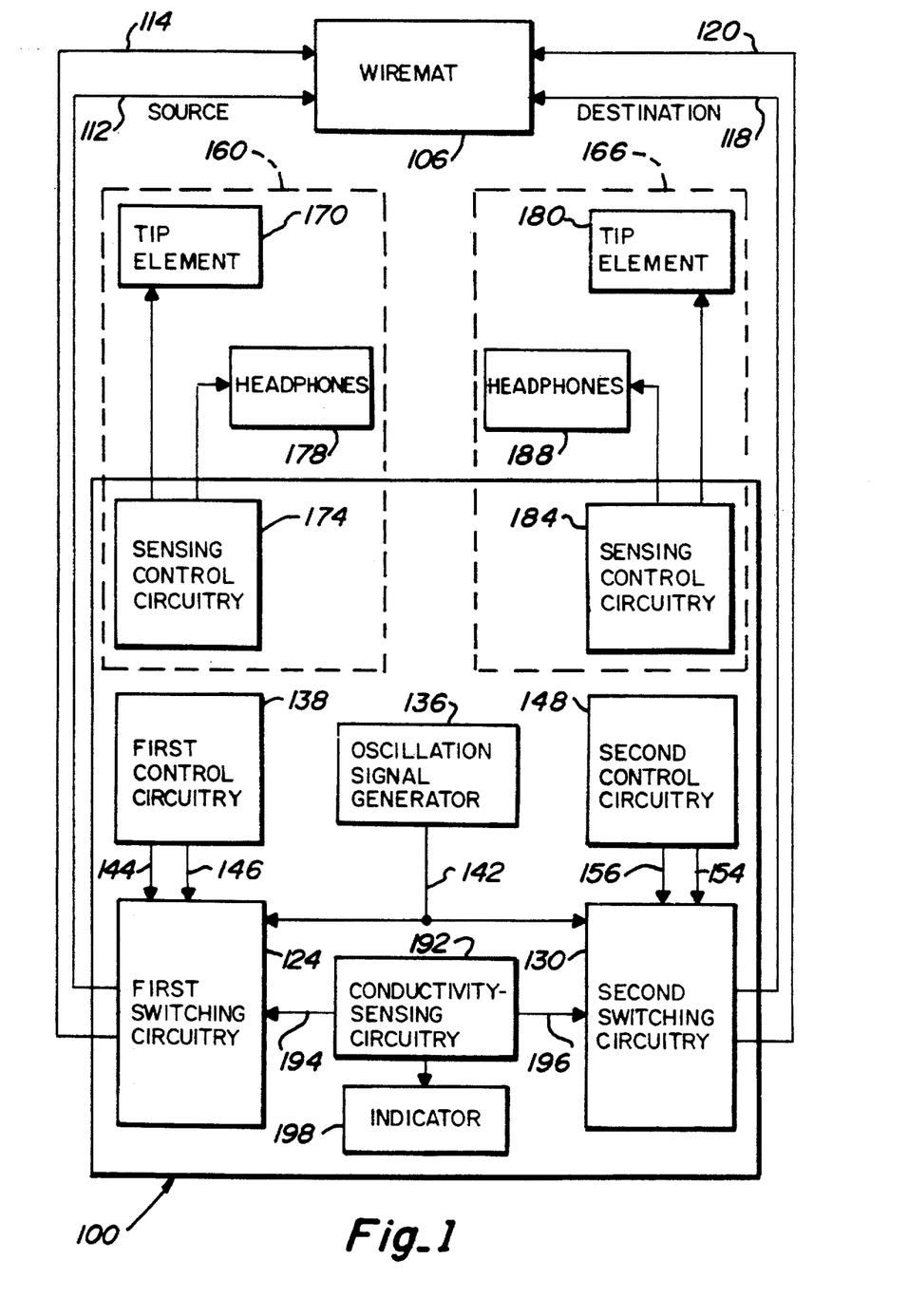
FIG. 1 is a generalized, functional block diagram of an assembly for locating a selected wire of a wiremat forming an embodiment of the present invention, positioned proximate to a plurality of wires which together form a wiremat.

With reference to FIG. 1, a presently-preferred embodiment of an assembly for locating a selected wire of a wiremat in accordance with the present invention is shown. The assembly is referred to generally by reference numeral 100 and is illustrated in a position proximate to a wiremat 106 formed of distal portions of a plurality of wires of which representative wires 112, 114, 118, and 120 are illustrated in the figure.

Proximal end portions of at least some of the wires which together form the wiremat 106 are coupled to first switching circuitry 124 and second switching circuitry 130. In the illustration shown, proximal end portions of the wires 112 and 114 are coupled to the switching circuitry 124, and proximal end portions of the wires 118 and 120 are coupled to the switching circuitry 130. While not shown, additional wires are similarly connected at proximal ends thereof to the first and the second switching circuitry 124 and 130.

An oscillation signal generator 136 of the assembly 100 generates an oscillating signal on line 142 which is applied both to the first switching circuitry 124 and to the second switching circuitry 130. The first switching circuitry 124 is operative to connect the line 142 to the proximal end portion of at least one wire, and preferably to proximal end portions of a pair of wires. The second switching circuitry 130 is similarly operative to connect the line 142 to the proximal end portion of at least one wire, and also preferably to proximal end portions of a pair of wires.

The oscillating signal generator 136 generates a constant frequency, oscillating signal which, when applied to the selected wires, such as wires 112, 114, 118, and 120, induces an electromagnetic field about the selected wires.

The first switching circuitry 124 is controlled by first control circuitry 138 by way of lines 144 and line 146, and the second switching circuitry 130 is controlled by second control circuitry 148 by way of lines 154 and line 156. The first control circuitry 138 generates signals on lines 144 and 146 to cause the first switching circuitry to connect, or to disconnect, selected wires (such as the wires 112 and 114) to line 142. Similarly, the second control circuitry 148 generates signals on lines 154 and 156 to cause the second switching circuitry 130 to connect, or to disconnect, selected wires (such as the wires 118 and 120) to line 142.

The first control circuitry 138 and the second control circuitry 148 generate the signals on lines 144, 146, 154, and 156, respectively, to cause the first and the second switching circuitry 124 and 130 to connect selected wires to line 142 to which the oscillating signal generated by the oscillation signal generator 136 is applied. The oscillating signal induces an electromagnetic field about the entire length of the selected wires of the wiremat 106, including the distal end portions thereof.

The assembly 100 further includes a first sensing probe 160 and a second sensing probe 166. The probes 160 and 166 are both operative to detect electromagnetic fields generated about the selected wires to which the oscillating signal generated by the oscillation signal generator 136 is applied when the selected wires are connected to the line 142 by the first or the second switching circuitry 124 or 130.

The first sensing probe 160 includes a tip element 170 which is coupled to sensing probe circuitry 174 which, in turn, is coupled to a speaker 178. Similarly, the second sensing probe 166 includes a tip element 180 which is coupled to sensing probe circuitry 184 which, in turn, is coupled to a speaker 188. The speakers 178 and 188 preferably form left and right speaker elements of a headset assembly which may be worn by an operator of the assembly 100.

An operator of the assembly 100 positions the tip elements 170 and 180 of the first and the second sensing probes 160 and 166 amongst the distal end portions of the plurality of wires (including the wires 112, 114, 118, and 120) which together form the wiremat 106. The operator of the assembly 100 moves the first and the second sensing probes 160 and 166 about the wires of the wiremat to position the tip elements 170 and 180 proximate to the selected wires to which the oscillating signal generated by the oscillating signal generator 136 is applied.

When the tip elements 170 and 180 are positioned proximate to the selected wires to which the oscillating signal is applied, the tip elements 170 and 180 detect the electromagnetic fields induced about such wires. When a tip element 170 or 180 detects such electromagnetic field, the tip element generates signals indicative of the strength of the electromagnetic field and the signals are supplied to the respective sensing probe circuitry 174 or 184.

Responsive to times in which the tip element 170 is positioned proximate to a selected wire to which the oscillating signal is applied, the sensing probe circuitry 174 generates a signal which is applied to the speaker 178 to provide an operator of the assembly 100 with an indication that the tip element 170 is positioned proximate to such wire. Similarly, responsive to times in which the tip element 180 is positioned proximate to a selected wire to which the oscillating signal is applied, the sensing probe circuitry 184 generates a signal which is applied to the speaker 188 to provide the operator of the assembly 100 with an indication that the tip element 180 is positioned proximate to such wire.

When the first and the second control circuitry 138 and 148 are operative to cause the first and the second switching circuitry 124 and 130, respectively, to apply the oscillating signal generated upon line 142 to the proximal end portions of selected wires, an operator of the assembly 100 can utilize the sensing probes 160 and 166 to locate distal end portions of such wires by indicating times in which the probes 160 and 166 are positioned in proximity to such wires.

By applying the oscillating signal to proximal end portions of first wires which are connected to the first switching circuitry 124 and to second wires which are connected to the second switching circuitry 130 (and wherein the first wires and the second wires are to be connected together at distal end portions thereof) the sensing probes 160 and 166 facilitate location of the distal end portions of such wires amongst the plurality of wires which together form the wiremat 106.

Once the oscillating signal is applied to the wires which are to be connected theretogether, an operator of the assembly 100 positions the tip elements 170 and 180 of the sensing probes 160 and 166 amongst the wires which together form the wiremat 106. The operator moves the tip elements 170 and 180 amongst the wires of the wiremat to position them proximate to the selected wires to which the oscillating signal is applied. Once the wires are located, the operator of the assembly 100 thereafter connects the wires to one another.

The assembly 100 further includes conductivity sensing circuitry 192 which is connected to the first switching circuitry 124 by way of line 194 and to the second switching circuitry 130 by way of line 196. The conductivity sensing circuitry 192 is operative to provide an indication of the quality of the connection between the wires which are subsequently connected together following their location through operation of the assembly 100.

The first switching circuitry 124 is further operative to connect line 194 and, hence, the conductivity sensing circuitry 192, to selected wires of the wires which are connected to the first switching circuitry 124. Similarly, the second switching circuitry 130 is further operative to connect line 196 and, hence, the conductivity sensing circuitry 192, to selected wires of the wires which are connected to the second switching circuitry 130. When the first and the second switching circuitry 124 and 130 interconnect the conductivity sensing circuitry 192 with wires which have been connected together (or which are believed to have been connected together) after having been located during operation of the assembly 100, the assembly 100 is further operative, by operation of the conductivity sensing circuitry 192 to determine the quality of the connection between the wires. An indicator 198 is coupled to the conductivity sensing circuitry 192 to provide an indication of the quality of the electrical connection between the wires as determined by the circuitry 192.

Figure 2:
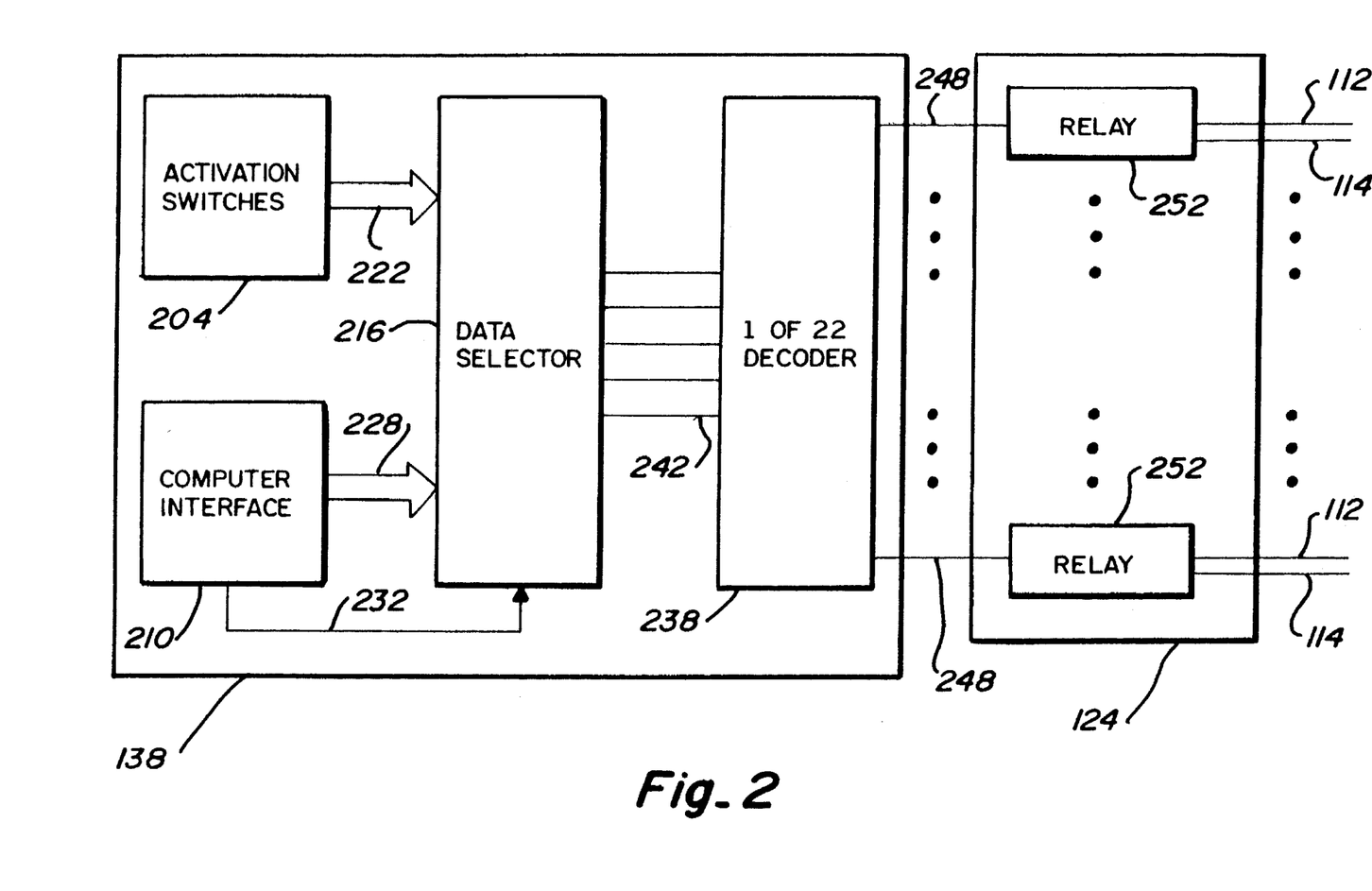
FIG. 2 is a block diagram of a first switching circuit which forms a portion of the embodiment shown in FIG. 1.

FIG. 2 illustrates, in greater detail, the first control circuitry 138 and the first switching circuitry 124 of the assembly 100 shown in FIG. 1. The second switching circuitry 130 includes circuitry which is identical with that of the first switching circuitry 124 and the first control circuitry 138 corresponds to that of second control circuitry 148.

The first control circuitry 138 includes manually actuated switches 204 which are preferably binary-encoded, rotary switches. An operator of the assembly 100 actuates the switches 204 to cause the first switching circuitry 124 to connect selected wires of the wires connected to the first switching circuitry 124 to the line 142 (shown in FIG. 1) to which the oscillating signal is applied. The first control circuitry 138 shown in FIG. 2 further includes a computer interface 210 which permits a computer (not shown) to generate signals to cause desired switching of the first switching circuitry 124.

The manually actuated switches 204 are connected to a data selector 216 by way of lines 222, and the computer interface is connected to the data selector 216 by way of lines 228. Line 232 further extends between the computer interface 210 and the data selector 216. When a computer is operative to control operation of the first switching circuitry 124, a signal is generated on line 232 to cause the data selector 216 to pass the signals supplied on the lines 228 to the decoder 238 by way of lines 242. If no signal is generated on line 232, the data selector 216 is operative to provide the signals provided thereto on lines 222 to the decoder 238 by way of lines 242.

The decoder 238, here a one-of-twenty-two decoder, generates a signal on one of the output lines 248 which interconnect the decoder 238 and the first switching circuitry 124.

The first switching circuitry 124 includes a plurality of relays 252. In the embodiment illustrated in FIG. 2, the first switching circuitry 124 includes twenty two relays 252. Each relay 252 is coupled to an individual output line 248 of the decoder 238. When the decoder 238 generates a signal on a particular one of the lines 248, the relay 252 connected thereto becomes energized. As the particular output line 248 of the decoder 238 upon which a signal is generated is dependent upon actuation of the manually actuated switches 204 or signals received by the computer interface 210, actuation of the switches 204 or reception of the signals through the computer interface 210 is determinative of which of the relays 252 is energized. Pairs of wires, such as the wires 112 and 114, are connected to contacts of the various relays 252 of the first switching circuitry 124.

The second switching circuitry 130 and the second control circuitry 148 includes circuitry identical with that of the first switching circuitry 124 and the first control circuitry 138. The second switching circuitry 130 and the second control circuitry 148 is similarly operable to cause energization of a relay which forms a portion of the second switching circuitry 130.

Figure 3:
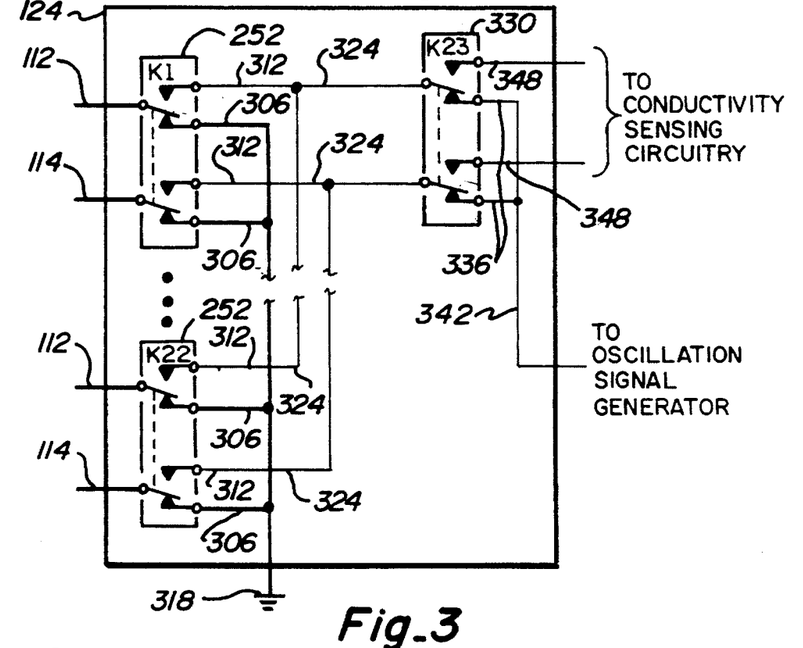
FIG. 3 is a more detailed schematic representation of the relay circuits forming portions of the selector circuitry of FIG. 2.

The circuit schematic of FIG. 3 illustrates the first switching circuitry 124 and the relays 252 thereof in greater detail. Two relays 252 of the switching circuitry 124 are illustrated in the figure. The relays 252 each include two normally-closed contacts 306 and two normally-open contacts 312. Wires, such as wires 112 and 114, are coupled to common sides of the sets of contacts 306 and 312 of each relay 252.

The normally-closed contacts 306 of each of the relays 252 are coupled to a ground potential 318. Hence, when the relays 252 are not energized, the wires, such as the wires 112 and 114 which are coupled to the common sides of the contacts 306 and 312 are coupled to the ground potential 318 through the normally-closed contacts 306 of the relays 252. The circuit paths to the ground potential 318 are shown by the bold lines in the figure.

When a relay 252 is energized, the normally-closed contacts 306 of the relay 252 open. The wires connected at the common sides of the contacts of the relay 252 are thereby disconnected from the ground potential 318 as the normally-closed contacts 306 open. The wires instead become connected to the normally-open contacts 312 as the normally-open contacts 312 close when the relay 252 becomes energized.

The normally-open contacts 312 of the relays 252 are coupled by way of lines 324 to common sides of the contacts of a relay 330 as shown. The normally-closed contacts 336 of the relay 330 are coupled to the oscillation signal generator 136 (shown in FIG. 1) by way of line 342 and the normally-open contacts 348 of the relay 330 are coupled to the conductivity sensing circuitry 192 (shown in FIG. 1). A signal generated by the first control circuitry 138 on line 144 (shown in FIG. 1) causes energization of the relay 330. A relay of the second switching circuitry 130 which corresponds directly to the relay 330 of the first switching circuitry 124 is energized by a signal generated by the second control circuitry 148 on line 156 (shown in FIG. 1).

Hence, when a particular relay 252 is energized, the wires connected to the common sides of the contacts of the relay 252 are coupled to the oscillation signal generator 136 when the relay 330 is not energized and to the conductivity sensing circuitry 192 when the relay 330 is energized.

Because only one relay 252 of the first switching circuitry 124 is energized at any particular time, all of the wires coupled to all others of the relays 252 are coupled to the ground potential 318. In this manner, capacitive coupling between the wires connected to the not energized relays 252 and the wires connected to the energized relay 252 (and to which the oscillating signal generated by the oscillation signal generator 136 is applied) is minimized.

Figure 4:
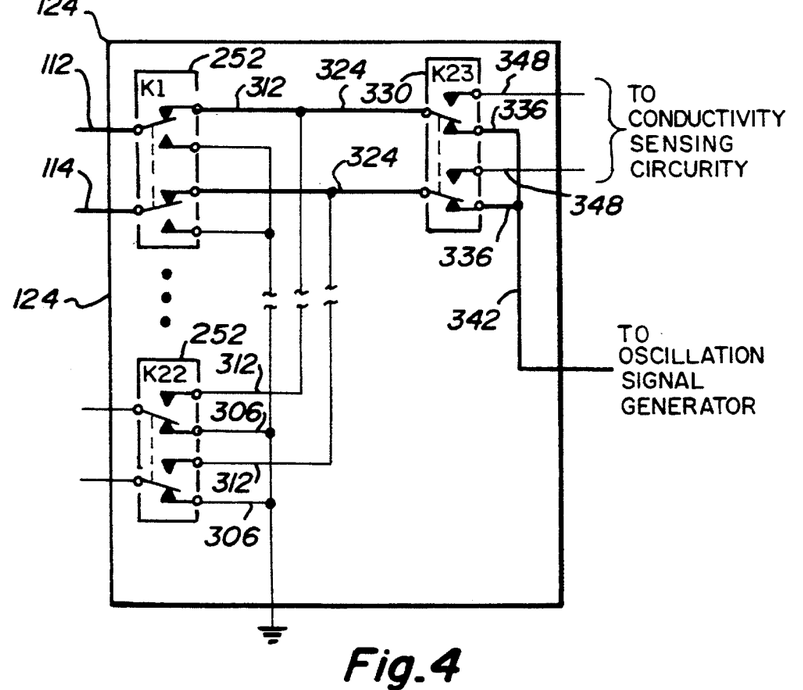
FIG. 4 is a schematic representation of the relay circuits of FIG. 3 illustrating a circuit path formed when the oscillation signal generator is connected by thee selector circuitry to apply an oscillating signal to a selected wire during operation of the assembly shown in FIG. 1.

The schematic representation of the first switching circuitry 124 shown in FIG. 4 corresponds to the schematic representation shown in FIG. 3, but represents the circuit path which is formed between the wires 112 and 114 and the oscillation signal generator 136 when one of the relays 252, here the top (as shown) relay 252, is energized. The circuit paths between the wires 112 and 114 and the oscillation signal generator 136 are shown by bold lines in the figure. The relay 330 is not energized, thereby to connect the lines 324 to the oscillation signal generator 136 by way of the normally-closed contacts 336 of the relay 330. Other structure of the first switching circuitry 124 shown in FIG. 4 corresponds with corresponding structure of the first switching circuitry 124 shown in FIG. 3 and the foregoing description thereof shall suffice herefore.

Figure 5:
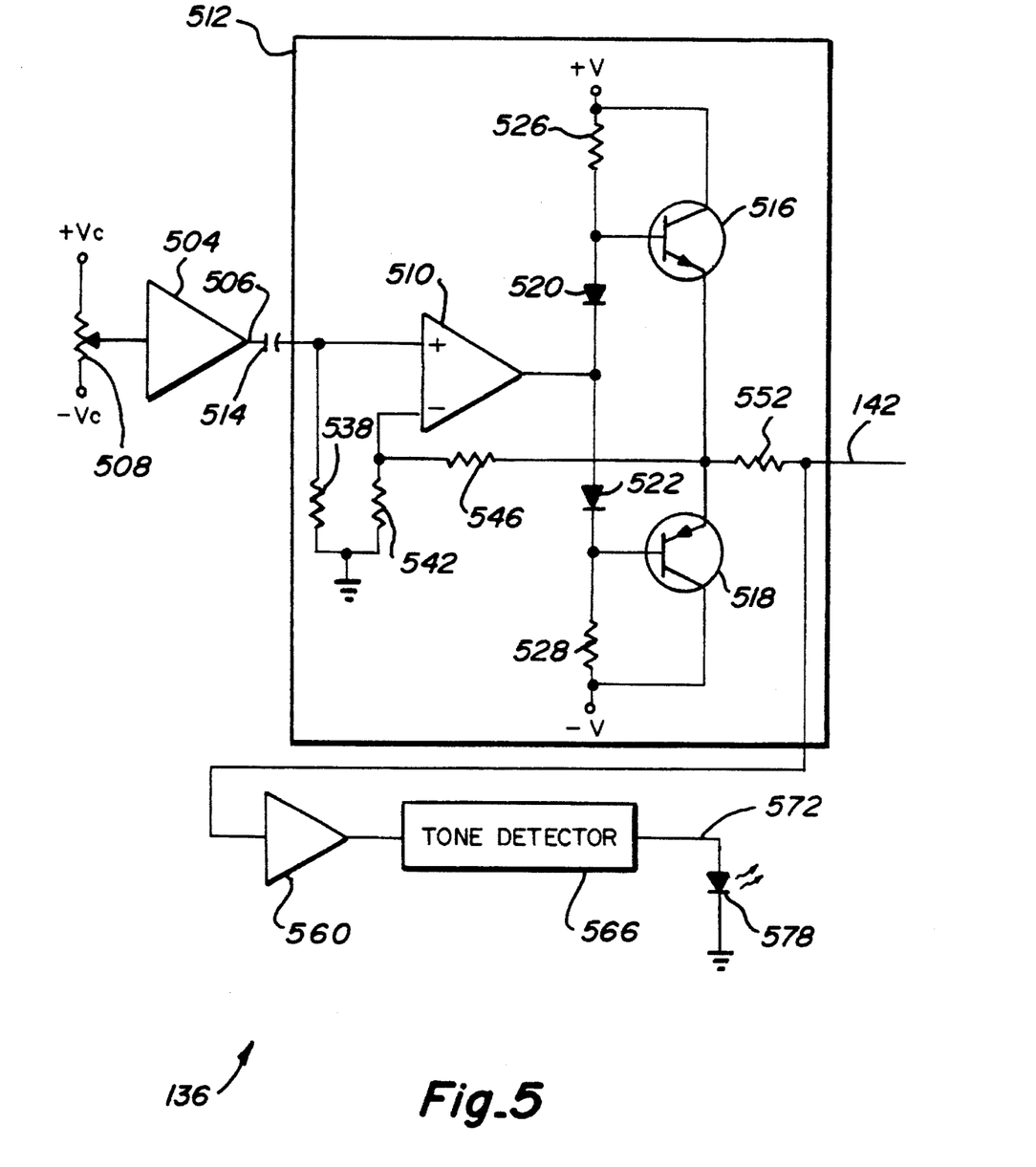
FIG. 5 is a circuit schematic of the oscillation signal generator which forms a portion of the assembly shown in FIG. 1.

FIG. 5 is a circuit schematic of the oscillation signal generator 136 which forms a portion of the assembly 100 shown in FIG. 1. As mentioned previously, the oscillation signal generator 136 is operative to generate an oscillating signal on line 142. The generator 136 includes an oscillator 504 which generates a cyclic signal on line 506 of a frequency dependent upon the resistance of a potentiometer 508 which is coupled across positive and negative control voltages $+/- V_c$.

The cyclic signal generated by the oscillator 504 is applied to a positive input of an operational amplifier 510 of an amplifier circuit 512 through a blocking capacitor 514. The operational amplifier 510 forms a preamplifier circuit for a standard, class AB complementary push-pull amplifier circuit having emitter-coupled transistors 516 and 518. Base electrodes of the transistors 516 and 518 are coupled to the output of the amplifier 510 through diodes 520 and 522, respectively. The base electrode of the transistor 516 is also coupled to a positive control voltage, $+V_c$, through a resistor 526, and a resistor 528 is connected between the base electrode of the transistor 518 and a negative control voltage, $-V_c$. The collector electrodes of the transistors 516 and 518 are coupled directly to the positive and negative control voltages, $+/- V_c$, respectively.

A resistor 538 is connected between the positive input of the operational amplifier 510 and a ground potential; a resistor 542 is connected between a negative input of the operational amplifier 510 and the ground potential; and a resistor 546 is connected between the negative input to the operational amplifier 510 and the commonly connected emitter electrodes of the transistors 516 and 518. The values of the resistors 538, 542, and 546 control the gain of the amplifier.

A resistor 552 is positioned in series between the commonly connected emitter electrodes of the transistors 516 and 518 and the line 142. The oscillating signal generated upon the line 142 corresponds in frequency with the cyclic signal generated upon line 506 but is of a magnitude dependent upon the gain of the amplifier 512.

The line 142 to which the oscillating signal is applied is also coupled through an attenuator 560 to a tone detector 566. The tone detector 566 detects frequencies of the oscillating signal generated upon line 142 and applies them to the tone detector 566. The center frequency of the tone detector 566 corresponds to the frequency of the cyclic signal generated upon line 506 by the oscillator 504. The tone detector 566 generates a signal on line 572 when the level of the oscillating signal falls below a selected value determined by the attenuator 560. The signal generated by the tone detector 566 on line 572 powers a light emitting diode 578 to provide a visual indication of the signal.

Figure 6A:
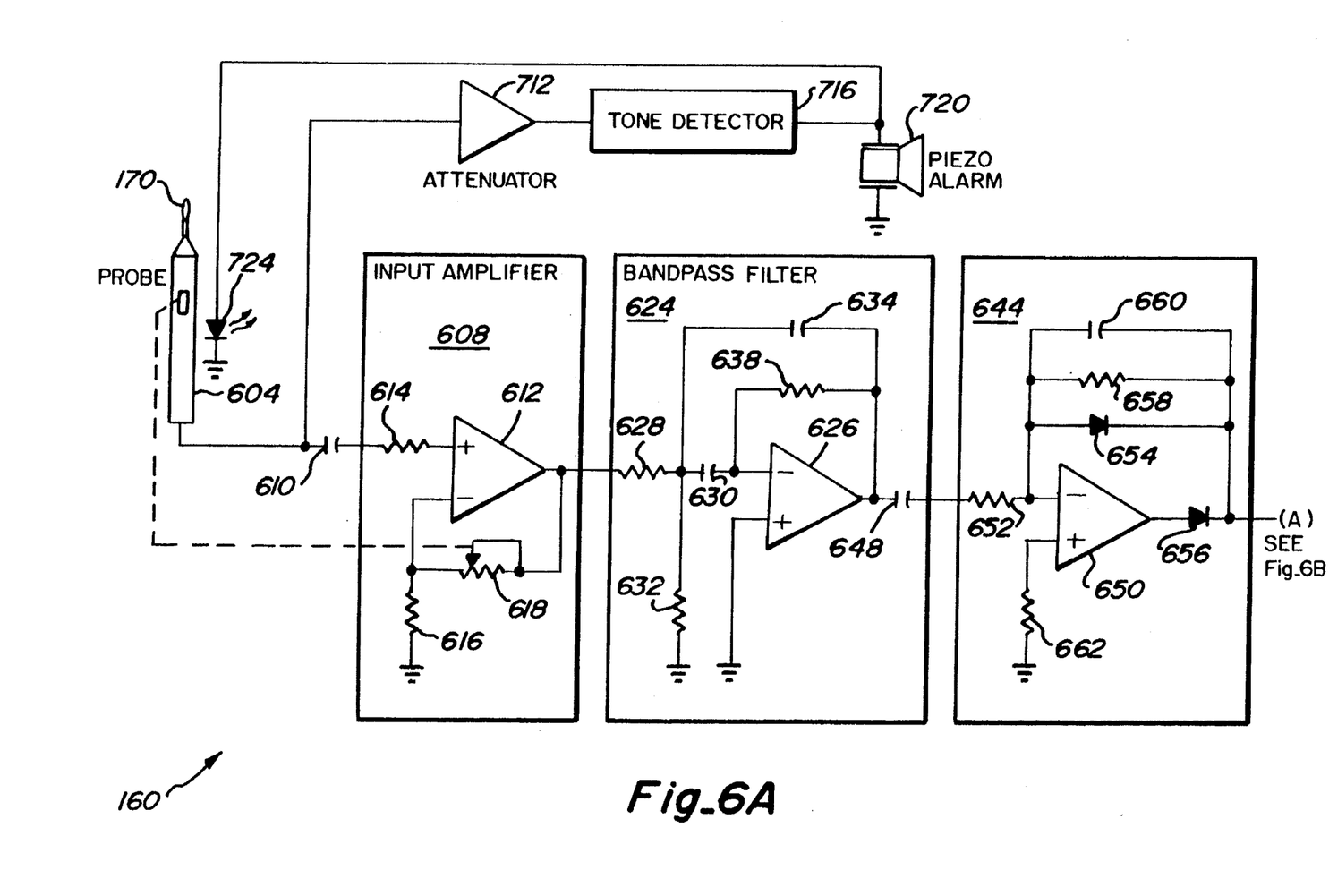
FIGS. 6A and 6B are a circuit schematic of a sensing probe which forms a portion of the assembly shown in FIG. 1.

The first sensing probe 160 is shown in simplified, circuit schematic form in FIG. 6A. While not separately illustrated, the second sensing probe 166 includes circuitry corresponding to the circuitry of the first sensing probe 160, and a circuit schematic of the second sensing probe 166 may be similarly represented.

The tip element 170 of a first sensing probe 160 is positioned at an end portion of a probe body 604 which is generally cylindrical and is of dimensions to permit an operator of the assembly 100 (shown in FIG. 1) to position the tip element 170 adjacent a plurality of wires which together form the wiremat 106 (also shown in FIG. 1).

Conductive leads extend through the probe body 604 to connect the tip element 170 to an amplifier circuit 608 through a blocking capacitor 610. The amplifier circuit 608 includes an operational amplifier 612 having a positive input thereof connected to the blocking capacitor 610 through a resistor 614. A negative input to the operational amplifier 612 is coupled to ground through resistor 616, and the negative input to the operational amplifier 612 is also coupled to the output of the operational amplifier through a variable resistor 618.

The elements of the amplifier circuit 608 are connected, as illustrated, to form a standard, non-inverting input amplifier.

The amplifier circuit 608 generates an amplified signal which is applied to a bandpass filter circuit 624. The filter circuit 624 includes an operational amplifier 626. A negative input of the operational amplifier 626 is coupled to receive the amplified signal generated by the amplifier circuit 608 through a series connected, resistor-capacitor combination 628, 630. A resistor 632 connects a node formed between the resistor 628 and the capacitor 630 to a ground potential, and a capacitor 634 connects the same node to an output of the operational amplifier 626. A resistor 638 interconnects the negative input of the operational amplifier 626 and the output of the amplifier. The positive input to the operational amplifier 626 is coupled to a ground potential.

The component elements of the filter circuit 624 are of values such that the passband of the filter circuit 624 passes signals of frequencies corresponding to that of the oscillating signal generated by the oscillation signal generator 136 and rejects signals of other frequencies. The filter circuit 624 is thereby operative to reject signals representative of the electromagnetic field sensed by the tip element 170 which are of frequencies which differ from the frequency of the oscillating signal generated by the oscillation signal generator 136.

The filtered signal generated by the filter circuit 624 is applied to a rectifier and DC filter circuit 644 through a blocking capacitor 648. The filter circuit 644 includes an operational amplifier 650 having a negative input which is coupled to the blocking capacitor 648 through a resistor 652. A diode 654 is connected between the negative input of the amplifier 650 and an output of the amplifier 650. A diode 656 is further coupled to the output of the operational amplifier 650 and a parallel-connected resistor 658 and capacitor 660 combination is connected between the negative input of the amplifier 650 and the diode 656 as shown. Also, a resistor 662 connects the positive input of the amplifier 650 to a ground potential.

The rectifier and DC filter circuit 644 is operative to convert the filtered ac signal generated by the bandpass filter circuit 624 into a steady, dc signal. The rectifier portion of the circuit 644 converts the ac signal applied to the circuit 644 into dc pulses, and the capacitor 660 is operative to smooth the dc pulses into a steady dc voltage signal.

Figure 6B:
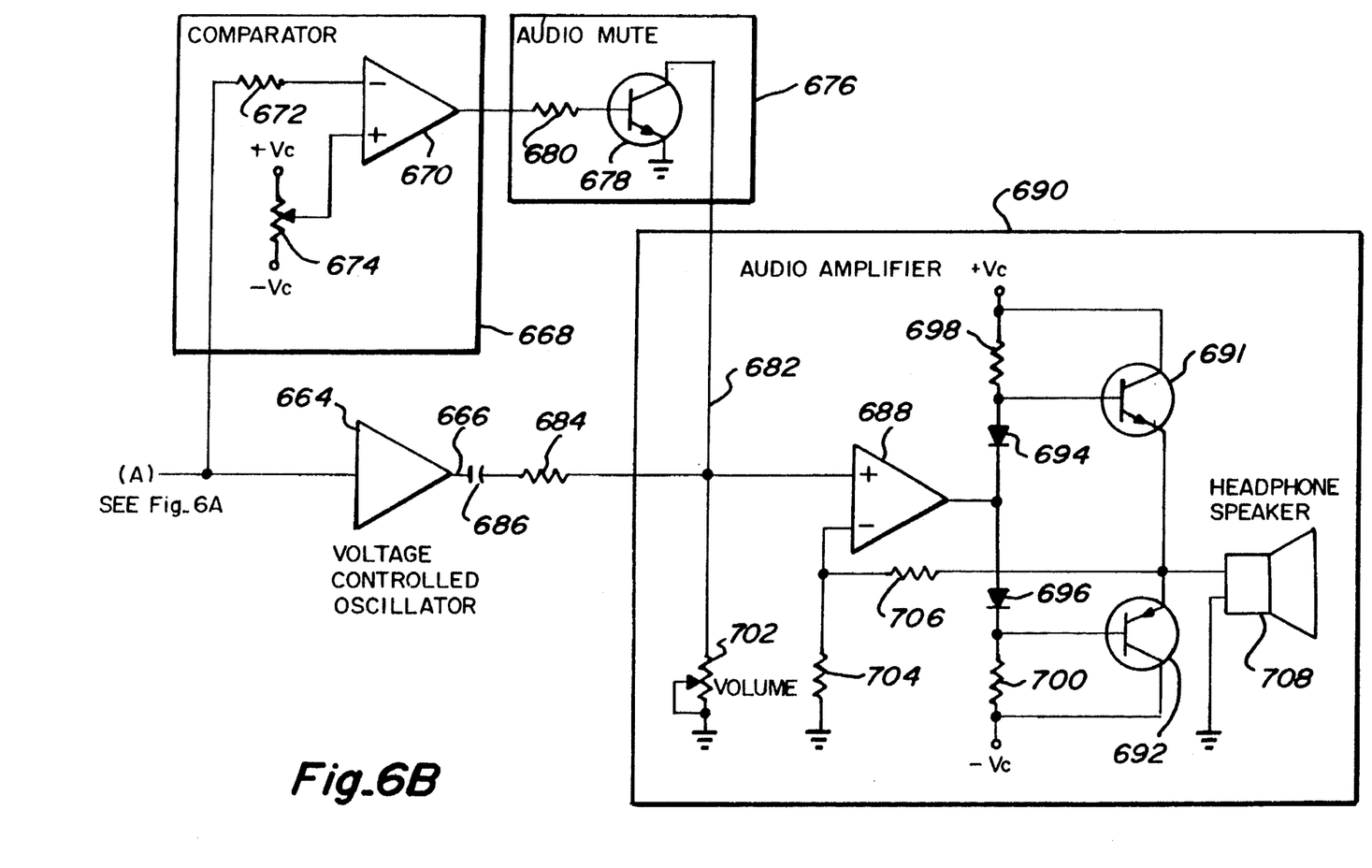

With reference additionally now to FIG. 6B, the dc signal generated by the rectifier and dc filter circuit 644 is applied to a voltage controlled oscillator 664. The voltage controlled oscillator 664 generates an oscillating signal on line 666 having a frequency related to the voltage level of the dc signal applied to the oscillator 664. The oscillator 664 is selected to permit generation of an oscillating signal having a frequency within an audible range.

The signal generated by the rectifier and filter circuit 644 (shown in FIG. 6A) is also coupled to a comparator circuit 668. The comparator circuit 668 includes an operational amplifier 670 which has a negative input coupled to receive the signal generated by the filter circuit 644 through a resistor 672. A positive input of the amplifier 670 is coupled to a variable resistor 674 which is coupled across positive and negative control voltage levels $+/- V_c$. The value of the variable resistor 674 is determinative of the reference voltage of the comparator circuit 668.

When the voltage level of the signal generated by the filter circuit 644 and applied to the negative input of the amplifier 670 is less than the voltage level of the signal applied to the positive input of the amplifier 670, the signal generated at the output of the amplifier 670 indicates such difference.

The signal generated by the comparator circuit 668 is applied to a mute circuit 676 which includes a transistor 678 having a base electrode coupled to receive the signal generated by the comparator circuit 668 through a resistor 680. The emitter electrode of the transistor 678 is coupled to a ground potential. When the signal generated by the filter circuit 644 is of a voltage level less than the reference voltage of the comparator circuit 668, the comparator circuit 668 generates a signal which, when applied to the transistor 678 through the resistor 680, is of a level to turn on the transistor 678.

When the transistor 678 is turned on, the output line 682 of the mute circuit 676 is of a ground potential. The output line 682 of the mute circuit 676 is coupled to the output of the voltage controlled oscillator 664 through a series connected resistor 684 and capacitor 686. When the transistor 678 is turned on, a circuit path is formed between the output of the oscillator 664 and the ground potential, thereby grounding the oscillating signal generated by the oscillator circuit 664.

The output signal generated by the voltage controlled oscillator 664 is applied, through the capacitor 686 and the resistor 684, to a positive input of an operational amplifier 688 of an amplifier circuit 690. When the transistor 678 of the mute circuit 676 is turned off, the oscillating signal generated by the oscillator 664 is applied to the operational amplifier 688 without being shunted to the ground potential. The operational amplifier 688 forms a preamplifier circuit for a standard, class AB complementary push-pull amplifier formed of emitter coupled transistors 691 and 692, which have base electrodes coupled to the output of the operational amplifier 688 through diodes 694 and 696 respectively. The base electrode of the transistor 691 is coupled to a positive control voltage, $+V_c$, through a resistor 698, and a resistor 700 is connected between the base electrode of the transistor 692 and a negative control voltage, $-V_c$. The collector electrodes of the transistors 691 and 692 are coupled directly to the positive and negative control voltages, $+/- V_c$, respectively.

A variable resistor 702 is connected between the positive input of the amplifier 688 and a ground potential; a resistor 704 is connected between a negative input of the amplifier 688 and the ground potential; and a resistor 706 is connected between the negative input of the amplifier 688 and the commonly coupled emitter electrodes of transistors 691 and 692. The values of the resistors 702, 704, and 706 are determinative of the gain of the amplifier circuit 690.

The amplifier circuit 690 is coupled to a transducer, here a speaker 708 to convert an amplified signal into audible form.

Referring to FIG. 6A, the first sensing probe 160 further includes an attenuator 712 which has an input coupled to receive, as an input thereto, the signals generated by the tip element 170 positioned at the end portion of the probe body 604. The output of the attenuator 712 is coupled to a tone detector 716 which is formed of an integrated circuit and is of a center frequency corresponding to the frequency of the oscillating signal generated by the oscillation signal generator 136.

The tone detector 716 is operative to sense times in which the tip element 170 of the sensing probe 160 is positioned in physical connection with a wire upon which an oscillating signal generated by the oscillation signal generator 136 is generated. When the tone detector 716 detects such connection, an output signal is generated to drive an audible alarm, here a piezo alarm 720, and a visual indicator, here a light emitting diode 724.

The first sensing probe 160 is operative to provide an audible indication of times in which the tip element 170 is positioned proximate to a wire to which an oscillating signal generated by the oscillation signal generator 136 is applied. Additionally, when the tip element 170 is positioned in direct electrical contact with the wire to which the oscillating signal is applied, an audible alarm and visual indication is provided of such contact.

Because the bandpass filter circuit 624 filters out signals of frequencies which are outside the frequency of the oscillating signal generated by the oscillation signal generator 136, the problems associated with interference caused by noise or spurious signals is minimized.

Additionally, because the amplified signal generated by the amplifier circuit 690 (shown in FIG. 6B) is a constant magnitude signal of a frequency corresponding to the frequency of the signal generated by the voltage controlled oscillator 664, the audible signal generated by the speaker 708 is of a frequency proportional to the proximity of the tip element 170 to a wire to which an oscillating signal generated by the oscillation signal generator 136 is applied. The audio mute circuit 676 is operative to mute the generation of an audible signal by the speaker 708 when the magnitude of the signal generated by the tip element 170 is less than a selected magnitude. Hence, an audible signal is generated by the speaker 708 only when the tip element 170 is positioned within a preselected distance from a wire to which the oscillating signal is applied.

Figure 7:
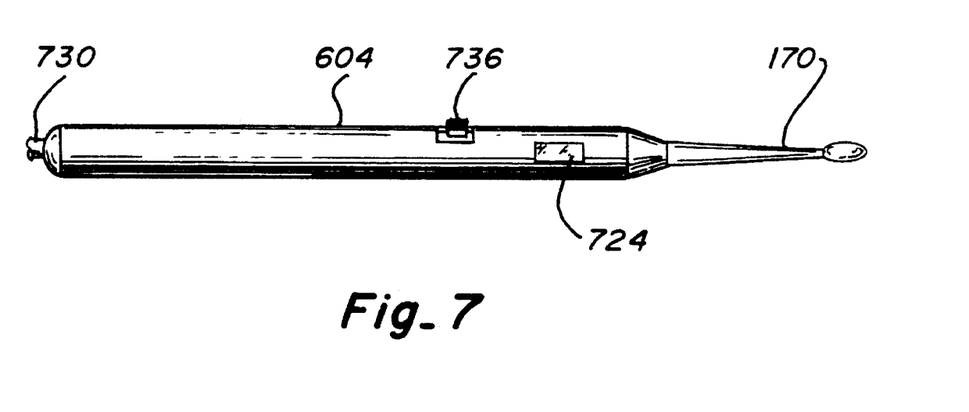
FIG. 7 is a side-elevational view of the sensing probe shown in schematic form in FIG. 6.

The probe body 604 and the tip element 170 of the first sensing probe 160 are also shown in more detail in the side elevational view of FIG. 7. The probe body 604 is of dimensions permitting an operator of the assembly 100 to grasp the probe body 604 and to position the tip element 170 (which is supported to extend from an end portion of the probe body 604) adjacent a plurality of wires of a wiremat 106. The tip element 170 detects the proximity to a wire to which an oscillating signal is applied by sensing the electromagnetic field surrounding the wire induced by the oscillating signal.

Signals sensed by the tip element 170 are generated upon a line which extends through the probe body 604 and through a cable 730 which extends beyond a rear end of the probe body 604. A selector switch 736 is supported at the probe body 604 and is operative to select the level of resistance of the variable resistor 618, shown in FIG. 6A. The switch 736 is preferably a four-level switch which is actuatable to select four levels of gain of the amplifier circuit 608. The light emitting diode 724 which is powered when the tip element 170 is positioned in electrical contact with a wire to which the oscillating signal generated by the oscillation signal generator 136 is applied is also supported by the probe body 604.

The second sensing probe 166 includes structure identical with that shown in FIG. 7 of the first sensing probe 160 and is similarly operable to permit an operator of the assembly 100 to locate selected wires in the wiremat 106.

Figure 8:
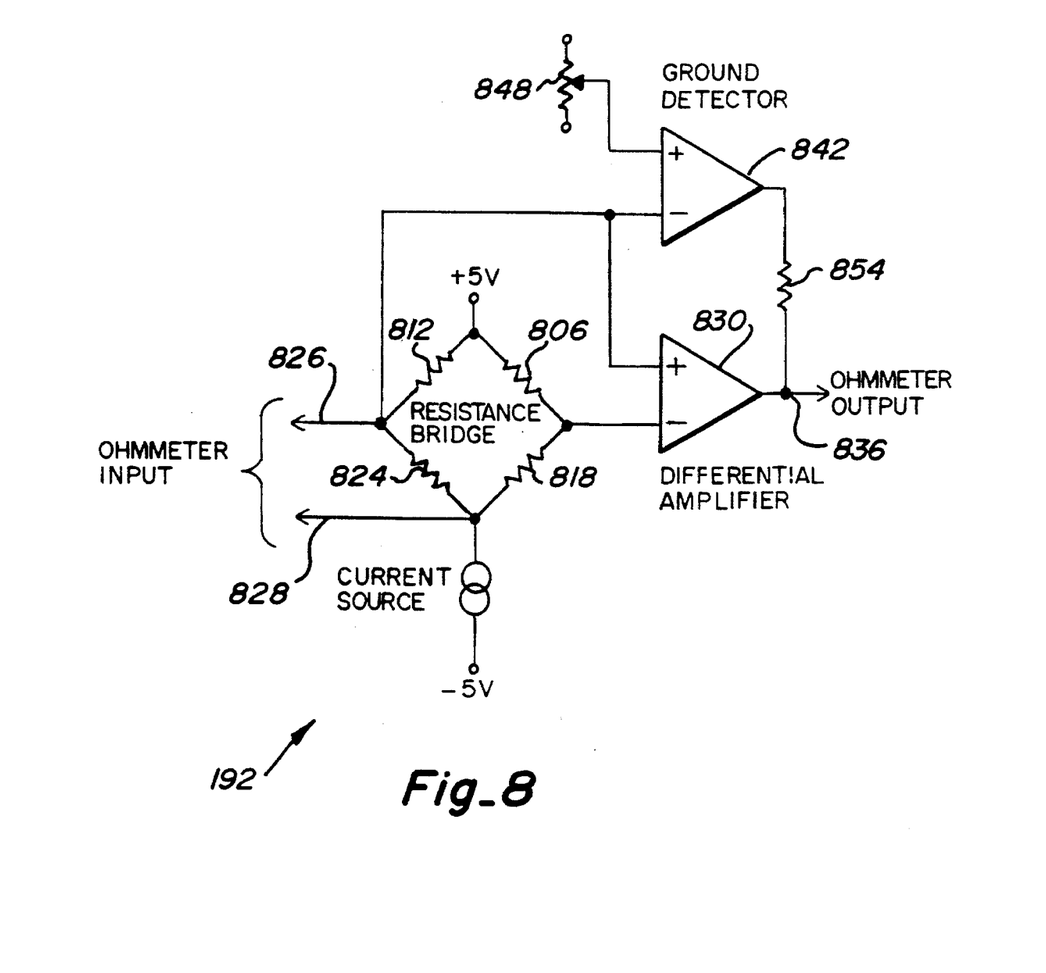
FIG. 8 is a circuit schematic of the conductivity sensing circuitry which forms a portion of the assembly shown in FIG. 1.

The circuit schematic of FIG. 8 illustrates the circuitry of the conductivity sensing circuitry 192 shown in block form in FIG. 1. The circuitry 192 includes a resistance bridge circuit operative to determine the quality of the connection between wires which are connected together once located during operation of the assembly 100.

The resistance bridge circuit of the conductivity sensing circuitry 192 is formed of a bridge of resistors including resistors 806, 812 and 818 which are of known values and which are coupled to positive and negative control voltages $+/- V_c$ in a conventional manner. A resistance, designated by reference numeral 824, completes the resistance bridge and is representative of the resistance of the wires which have been, or which are believed to have been, connected together. The bridge circuit formed of the resistors 806, 812, 818 and 824 provides an offset voltage transfer function scaled in terms of 10 microvolts/milliohm.

If the wires are correctly, and adequately, connected together, the resistance of the wires, as represented by resistance 824 in FIG. 8, is low. When the resistance of the resistance 824 is of a low value, the bridge circuit formed of the resistors 806, 812, 818 and 824 is only slightly offset, and the voltage differential between the voltages at the nodes between resistor 812 and resistance 824 and that between the resistors 806 and 818 is small. As the nodes between the resistor pairs 812, 824 and 806, 818 are coupled to positive and negative inputs, respectively, of a differential amplifier 830, the amplified difference signal generated on line 836 at the output of the differential amplifier 830 would also be fairly small in this instance. The signal generated on line 836 may be provided, for example, to an analog-to-digital converter (not shown) or may be provided directly to an indicator, such as the indicator 198 shown in FIG. 1.

If the connection between the wires is inadequately formed, the resistance of the resultant connection is significant, and the resistance 824 is a large value. If no connection has been created, an open circuit is formed, and there is a large voltage differential between the signals applied to the differential amplifier 830. Accordingly, when a miswire connection has been created (i.e., when a connection is mistakenly made between two wires which are not intended to have been connected together), or no connection is formed, a large differential signal is generated by the differential amplifier 830 on line 836.

A ground detector amplifier 842 also forms a portion of the conductivity sensing circuitry 192. A variable resistor 848 connected across positive and negative control voltages, +/- V$_c$, is coupled to a positive input of the amplifier 842. An output of the ground detector amplifier 842 is coupled to an output of the differential amplifier 830 through resistor 854. When a ground potential is formed as a result of a wire coupled to one of the inputs 826 or 828 to the circuitry 192 being shorted to ground, the output of the ground detector amplifier 842 alters the value of the signal generated on line 836 to provide an indication of a miswire connection or of an open connection as appropriate.

Figure 9:
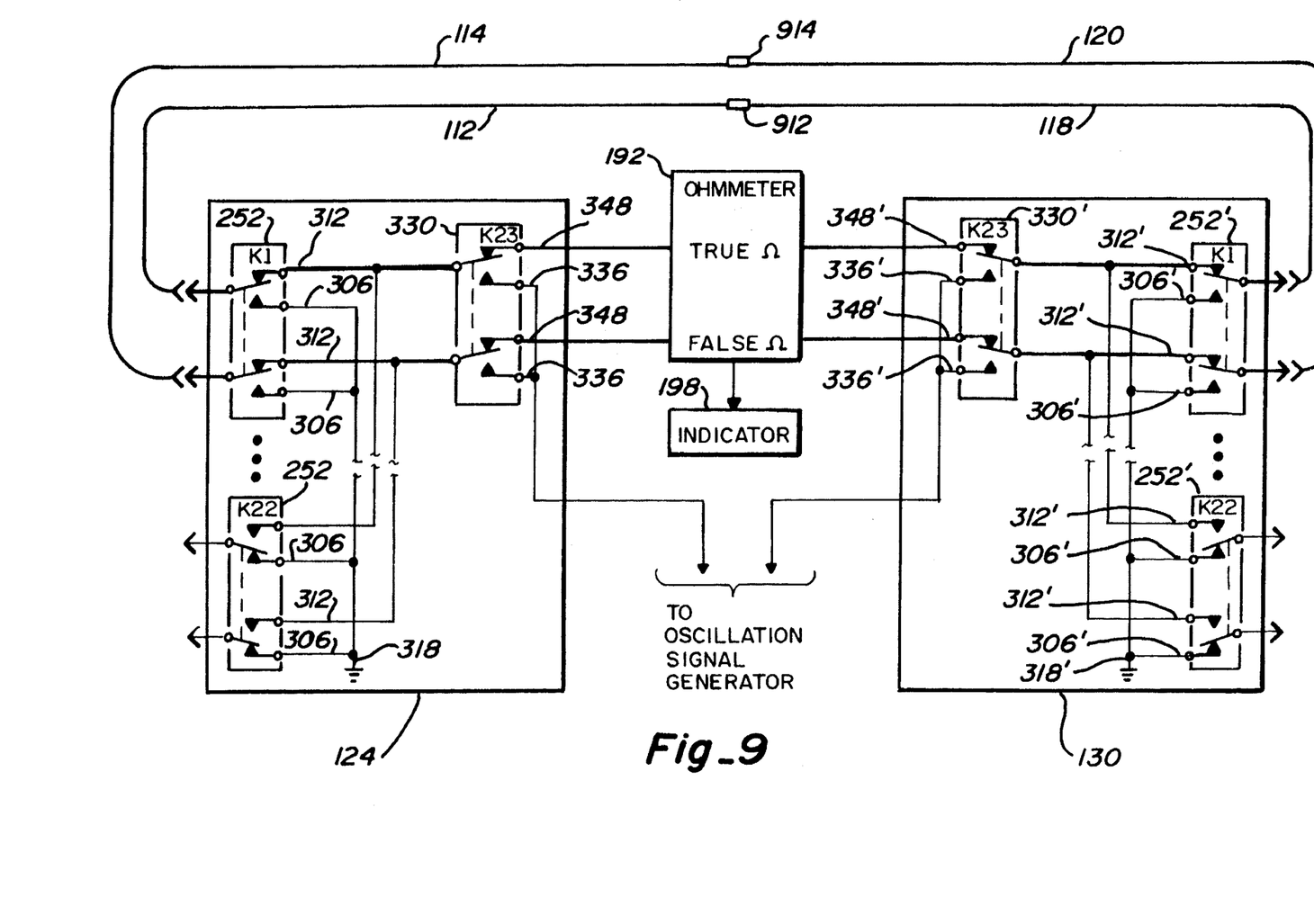
FIG. 9 is a schematic representation which illustrates a circuit path formed when the conductivity sensing circuitry is connected by the selector circuitry to test the quality of connections between wires once located during operation of the assembly shown in FIG. 1, and thereafter connected together.

FIG. 9 illustrates the conductivity sensing circuitry 192 when connected by the first and the second switching circuitry 124 and 130 to measure the quality of connections between wires, such as wires 112, 118 and 114, 120 once the same have been located during operation of the assembly 100 shown in FIG. 1.

Relays 252 forming portions of the first switching circuitry 124 were previously described in detail with respect to the description of FIG. 3. As the second switching circuitry 130 includes elements identical with that of the first switching circuitry 124, the elements of the second switching circuitry are identified by reference numerals used to identify corresponding circuitry of the first switching circuitry 124 and differentiated therefrom by the addition of prime (') designations.

Wires 112 and 114 extending from the first switching circuitry 124 are connected to wires 118 and 120, respectively by way of solder connections 912 and 914.

The first and the second control circuitry 136, 148 (shown in FIG. 1) energize the relays 330 and 330' of the first and second switching circuitry 124, 130 to connect the conductivity sensing circuitry 192 through the normally-open contacts of the respective relays 330 and 330' and also through the normally-open contacts of the energized relays 252 and 252' from which the wires 112, 114 and 118, 120 extend. The circuit paths formed between the conductivity sensing circuitry 192 and these wires are indicated by bold lines in FIG. 9.

The bridge circuit of the conductivity sensing circuitry 192 when connected to the wire combinations 112, 118 and 114, 120 is operative to determine the resistance of such wire combinations together with the resistances of the solder connections 912 and 914. An indication of the values determined by the circuitry 192 is indicated by the indicator 198. In the illustration shown in FIG. 9, because the solder connections 912 and 914 are correctly and adequately formed to interconnect the wires 112 and 118 and the wires 114 and 120, the conductivity sensing circuitry 192 determines the resistances of the wire combinations 112, 118 and 114, 120 to be of low resistances.

Figure 10:
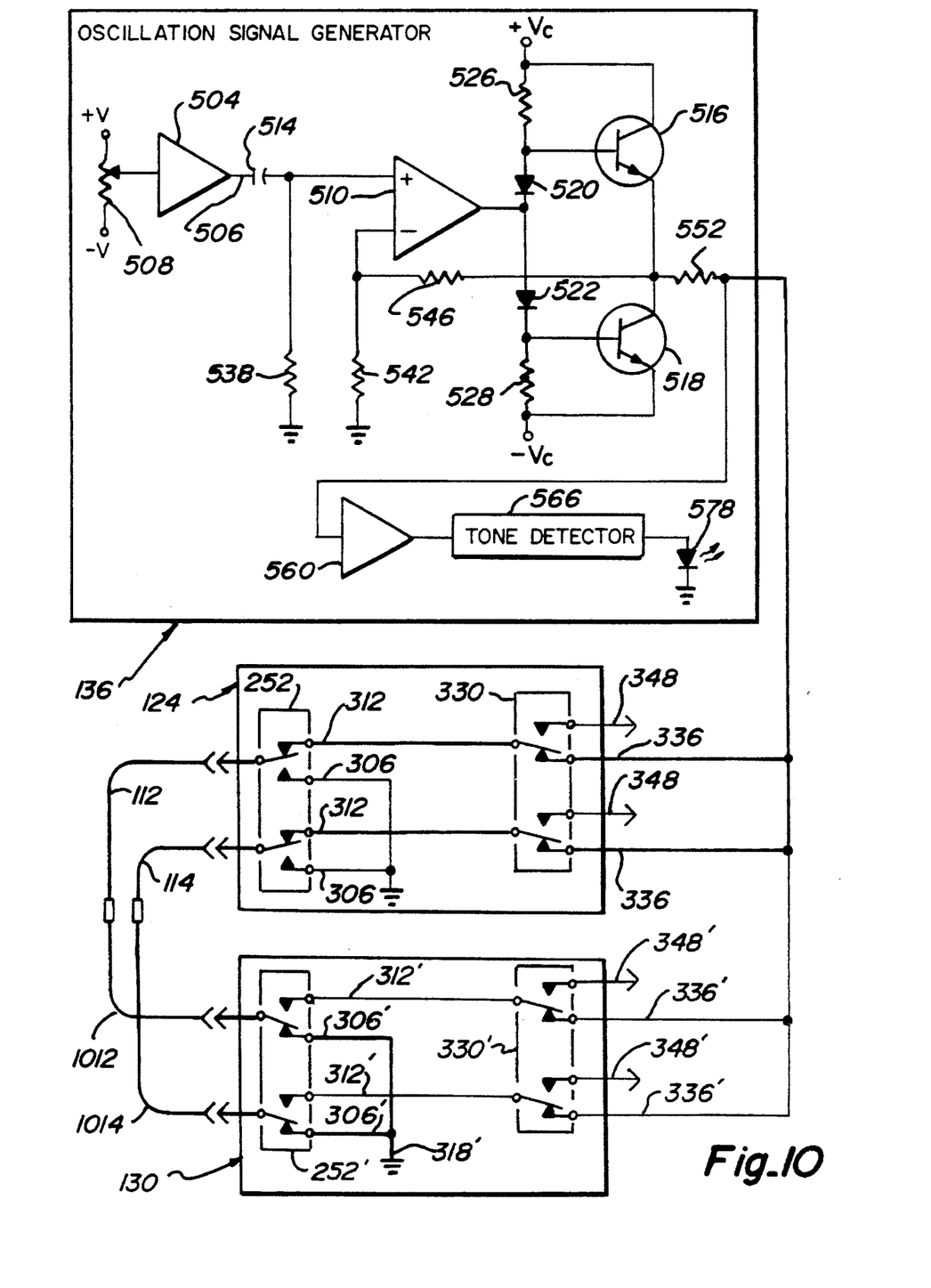
FIG. 10 is a schematic representation which illustrates a circuit path formed when wires located during operation of the assembly shown in FIG. 1 are misconnected to form a miswire connection.

The circuit schematic of FIG. 10 illustrates an example in which miswire connections have been formed between wires 112 and 1012 and 114 and 1014 extending from the first and second switching circuitry 124 and 130. That is to say, while wires 112 and 114 extending from the relays 252 of the first switching circuitry 124 should not be connected together with wires 1012 and 1014 of the circuitry 130, FIG. 10 illustrates a situation in which such wires have been mistakenly connected together to form the miswire connections.

When a miswire connection, such as either of the miswire connections illustrated in FIG. 10 is formed, at least one of the wires which form the miswire connections is connected to a normally-closed contact of a not energized relay which, in turn, is coupled to an electrical ground potential. Here the bottom (as shown) relay 252 of the first switching circuitry 124 forms a path to ground, and the circuit paths represented in the figure by the bold lines are all at a ground potential as a result of the connections through the normally-closed contacts of the not energized relay 252. When the circuit path is formed to the ground potential, the oscillating signal applied by the oscillation signal generator to line 142 is shorted to ground. The tone detector 566 of the oscillation signal generator 136 generates a signal to power the light emitting diode 578 to visually indicate a miswire connection.

The assembly 100 permits an operator to locate selected wires positioned amongst a plurality of wires which together form a wiremat, such as the wiremat 106 illustrated in FIG. 1. An oscillating signal is applied to proximal end portions of wires which are to be located during operation of the assembly 100. Other wires are coupled to a ground potential. An operator of the assembly 100 positions sensing probes amongst the plurality of wires forming the wiremat, and the sensing probes sense proximities of the probes to the wires upon which the oscillating signal generated by the oscillation signal generator is generated.

Because all but the selected wires to which the oscillating signal is applied are coupled to a ground potential, capacitive coupling between adjacently positioned wires of the wiremat 106 is minimized. The sensing probes include filter circuits for filtering out signals of all frequencies other than the frequency of the oscillating signal generated by the oscillation signal generator. Interference caused by noise and other spurious signals is thereby minimized so as not to interfere with location operations performed by operation of the assembly 100. Constant amplitude signals having frequencies which vary in response to the proximity of the sensing probes to the selected wires are generated to indicate proximity of the sensing probes to the selected wires. The assembly 100 is further operative, once the selected wires have been located and thereafter connected together, to determine the quality of the connections between the wires. Instances in which miswire connections are formed are further indicated.

Presently-preferred embodiments of the present invention have been described with a degree of particularity. The previous descriptions are of preferred examples for implementing the invention, and the scope of the invention should not necessarily be limited by this description. The scope of the present invention is defined by the following claims.

What is claimed is:

1. An assembly for locating a distal wire-portion of at least one selected wire positioned amongst a plurality of wires wherein each of the wires of the plurality of wires includes a distal wire-portion and a proximal wire-portion, said assembly comprising:

an oscillation signal generator for generating an electromagnetic field-generative, oscillation signal of a desired oscillation frequency, said oscillation signal generator coupled to a proximal side portion of the at least one selected wire for applying the electromagnetic field-generative oscillation signal to the at least one selected wire;

at least one sensing probe positionable amongst the plurality of wires and operative to sense proximity of the sensing probe to the distal wire-portion of the at least one selected wire upon which the electromagnetic field-generative, oscillation signal is generated by the oscillation signal generator, said at least one sensing probe including an elongated, conductive tip element supported to extend beyond a support tube, the conductive tip element for sensing electromagnetic fields generated by the electromagnetic field-generative, oscillation signal applied to the at least one selected wire by the oscillation signal generator and for converting the electromagnetic fields sensed thereat into electrical signals of signal values representative of values of the electromagnetic-fields, a filter circuit for filtering the electrical signals generated by the conductive tip element and for generating filtered signals, and rectifier circuitry coupled to receive the filtered signals generated by the filter circuit, said rectifier circuitry for rectifying the filtered signals supplied thereto and for generating rectified signals responsive to the filtered signals; and annunciator circuitry for generating an aural annunciator signal, the aural annunciator signal of a frequency of a value representative of the proximity of the at least one sensing probe to the distal wire-portion of the at least one selected wire, said annunciator circuitry including an annunciation oscillator coupled to receive the rectified signals generated by the rectifier circuitry of the at least one sensing probe, said annunciation oscillator for generating oscillating signals forming the aural annunciator signal, said oscillating signals being of frequencies responsive to values of the rectified signals generated by the rectifier circuitry, and a mute circuit for muting the aural annunciator signal when the rectified signals generated by the rectifier circuitry of the at least one sensing probe are of magnitudes less than selected values.

2. The assembly of claim 1 wherein said oscillation signal generator is comprised an oscillator which generates an oscillating signal and an amplifier coupled to receive the oscillating signal and operative to amplify the oscillating signal received thereat and to generate an amplified, oscillating signal which forms the electromagnetic field-generative oscillation signal for application to the at least one selected wire.

3. The assembly of claim 1 wherein said at least one sensing probe further comprises an amplifier for amplifying the electrical signals of the signal values representative of the values of the electromagnetic fields sensed by the conductive tip element.

4. The assembly of claim 1 wherein said filter circuit of the at least one sensing probe comprises a bandpass filter.

5. The assembly of claim 1 wherein the oscillating signals generated by the annunciation oscillator increase in frequency as the values of the rectified signals generated by the rectifier circuitry increase in magnitude whereby the frequency of the oscillating signals generated by the annunciator circuitry is representative of the proximity of the at least one sensing probe to the distal wire portion of the at least one selected wire.

6. An assembly for locating a distal wire-portion of at least one selected wire positioned amongst a plurality of wires wherein each of the wires of the plurality of wires includes a distal wire-portion and a proximal wire-portion, said assembly comprising:

an oscillation signal generator for generating an electromagnetic field-generative, oscillation signal of a desired oscillation frequency, said oscillation signal generator coupled to a proximal side portion of the at least one selected wire for applying the electromagnetic field-generative oscillation signal to the at least one selected wire;

at least one sensing probe positionable amongst the plurality of wires and operative to sense proximity of the sensing probe to the distal wire-portion of the at least one selected wire upon which the electromagnetic field-generative, oscillation signal is generated by the oscillation signal generator;

annunciator circuitry coupled to the at least one sensing probe for generating an aural annunciator signal, the aural annunciator signal of a frequency of a value representative of the proximity of the at least one sensing probe to the distal wire-portion of the at least one selected wire, and thereby to annunciate location of the distal wire portion of the at least one selected wire when the at least one sensing probe is positioned proximate thereto; and ground-connecting circuitry for connecting the proximate end portions of all but the at least one selected wire of the plurality of wires to a ground potential, said ground connecting circuitry including switching circuits formed of relay circuits having normally-open contacts and normally-closed contacts, and wherein the normally-closed contacts of each of the relay circuits are coupled to the ground potential such that, when a relay circuit of the relay circuits is unenergized, the wire of the plurality of wires connected thereto is connected to the ground potential by way of the normally-closed contact of the relay circuit and such that, when the relay circuit of the relay circuits is energized, the wire of the plurality of wires is disconnected out of the electrical connection with the ground potential when the normally-closed contact of the relay opens.

7. The assembly of claim 6 further comprising control circuitry for controlling positioning of the switching circuits.

8. The assembly of claim 7 wherein the switching circuits comprise a first set of switching circuits coupled to a first set of wires of the plurality of wires and a second set of switching circuits coupled to a second set of wires of the plurality of wires, and wherein the control circuitry which controls positioning of the switching circuits comprises a first control circuit for controlling positioning of the first set of switching circuits and a second control circuit for controlling positioning of the second set of switching circuits.

9. The assembly of claim 8 wherein the oscillation signal generator applies the electromagnetic field-generative, oscillation signal to a first-selected wire and to a second selected wire.

10. The assembly of claim 9 wherein the at least one sensing probe comprises a first sensing probe for sensing the proximity thereof to the first-selected wire and a second sensing probe for sensing the proximity thereof to the second selected wire.

11. The assembly of claim 10 wherein the first selected wire and the second selected wire are electrically-connected theretogether once located by the first sensing probe and the second sensing probe, respectively, and wherein the assembly further comprises conductivity-sensing circuitry for sensing conductivity between the first selected wire and the second selected wire, thereby to sense quality of electrical connection between the first- and second selected wires, respectively.

12. A method for locating a distal-wire portion of at least one selected wire that is positioned amongst a plurality of wires that are associated together to form a wiremat, wherein each wire of said plurality of wires includes a distal-wire portion and a proximal-wire portion, said method comprising the steps of:

applying an electromagnetic field generative oscillation signal of a desired oscillation frequency to only said distal-wire portion of said at least one selected wire;

providing switchable ground-connecting circuitry connecting said proximal-wire portions of all but said at least one selected wire to ground potential;

providing a proximity sensing probe that is constructed and arranged to sense an electromagnetic field strength of said desired frequency, and to thereby generate a variable frequency aural annunciator output signal, said frequency of said annunciator output signal being variable function of the physical proximity of said probe to a source of an electromagnetic field of said desired oscillation frequency;

moving said probe relative to said proximal-wire portion of said at least one selected wire; and generating said aural annunciator output signal, said aural annunciator output signal being of a frequency that is representative of the physical proximity of said probe to said proximal-wire portion of said at least one selected wire, thereby to annunciate the location of said proximal-wire portion of said at least one selected wire when said sensing probe is positioned thereat.

* * * * *